United States Patent [19]

Vance

[11] Patent Number: 4,488,064

[45] Date of Patent: Dec. 11, 1984

[54] INTEGRATED CIRCUIT WITH A COMMON POWER SUPPLY FOR SILICON AND GALLIUM ARSENIDE CIRCUIT PORTIONS

[75] Inventor: Ian A. W. Vance, Newport, England

[73] Assignee: International Standard Electric Corporation, New York, N.Y.

[21] Appl. No.: 404,746

[22] Filed: Aug. 3, 1982

[30] Foreign Application Priority Data

Aug. 25, 1981 [GB] United Kingdom ............... 8125865

[51] Int. Cl.³ ............... H03K 3/013; H03K 19/092; H03K 19/094

[52] U.S. Cl. ............... 307/297; 307/443; 307/475

[58] Field of Search ............... 307/443, 446, 450, 455, 307/475, 297, 304; 323/313–314

[56] References Cited

U.S. PATENT DOCUMENTS

| 4,008,406 | 2/1977 | Kawagoe | 307/443 X |
| 4,260,946 | 4/1981 | Wheatley, Jr. | 323/314 |
| 4,267,501 | 5/1981 | Smith | 323/313 |
| 4,300,061 | 11/1981 | Mihalich et al. | 323/313 X |
| 4,410,815 | 10/1983 | Ransom et al. | 307/475 |
| 4,414,503 | 11/1983 | Hashimoto | 307/297 X |

OTHER PUBLICATIONS

Blumberg et al., "Voltage Reference Supply", *IBM Tech. Disc. Bull.*, vol. 16, No. 3, 8-1873, pp. 1015-1016.

Primary Examiner—Stanley D. Miller
Assistant Examiner—David R. Hudspeth
Attorney, Agent, or Firm—John T. O'Halloran; Peter R. Ruzek

[57] ABSTRACT

A gallium arsenide logic circuit which forms part of a silicon/gallium arsenide logic interface, is provided with a negative supply voltage from a silicon logic gate whose output is held in its LOW condition. This obviates the need to provide separate power supplies to the two different semiconductor types.

5 Claims, 3 Drawing Figures

INTEGRATED CIRCUIT WITH A COMMON POWER SUPPLY FOR SILICON AND GALLIUM ARSENIDE CIRCUIT PORTIONS

BACKGROUND OF THE INVENTION

1. Field of the Invention

This invention relates to a circuit arrangement incorporating a plurality of integrated circuits, and in particular to such arrangements incorporating both silicon and gallium arsenide circuits.

2. Description of the Prior Art

Gallium arsenide integrated circuits are finding increasing applications in the field of high speed data processing. These circuits are commonly used as data multiplexers and demultiplexers and provide an interface between a transmission medium and a plurality of silicon integrated circuits. It will be appreciated that, because of the different electrical properties of gallium arsenide and silicon, it is necessary to provide a different supply voltage for each material. In the past, this has necessitated the provision of separate power supply circuits with the consequent duplication of expense.

SUMMARY OF THE INVENTION

The object of the present invention is to minimize or to overcome the requirement for separate power supply circuits.

According to the invention there is provided a circuit arrangement comprising a first circuit portion including a silicon integrated circuit provided with at least one logic gate, and a second circuit portion including a gallium arsenide integrated circuit, wherein the circuit arrangement is such that, in use, said logic gate is maintained in its low state, and wherein the power supply voltage for the gallium arsenide integrated circuit is, in use, defined by the output of said logic gate.

We have found that the output voltage level of a silicon logic gate, e.g. an emitter coupled logic (ECL) gate, is suitable for the section of gallium arsenide devices. Thus a single power supply will suffice for the operation of both types of semiconductor devices.

DESCRIPTION OF THE INVENTION

Figure 1:
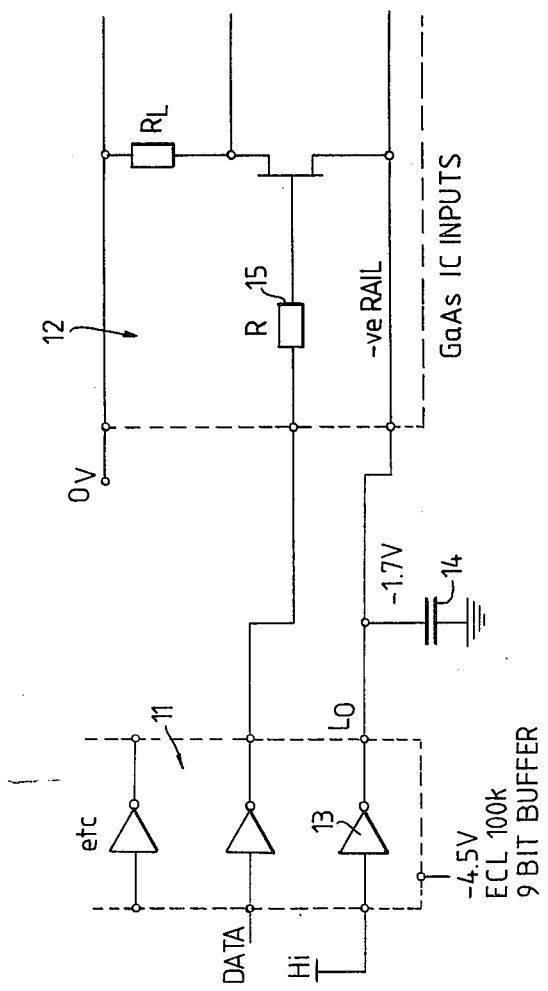
FIG. 1 is a schematic diagram of the input interface of a silicon/gallium arsenide multiplexer.

Referring to FIG. 1, the multiplexer input interface comprises a silicon input logic array 11, e.g. an emitter coupled logic (ECL) array, coupled to a gallium arsenide logic array 12, the latter providing the high switching speed necessary for rapid data handling. Typically the logic array 12 operates at a rate of the order of 1 G bit/sec.

Gallium arsenide enhancement mode field effect transistor logic (e-MESFET logic) has the property that the logic low voltage state must approach very nearly the low potential power supply rail voltage of the circuit to ensure correct operation of the devices. The circuit of FIG. 1 provides for correct operation of the gallium arsenide array 12 by supplying the negative supply rail with fixed defined voltage, typically −1.7 volts, from a gate 13 in the silicon array 11 which gate is held in its logic LOW state. Further stability of this supply may be provided by a decoupling capacitor 14 coupled between the gallium arsenide negative supply rail and the circuit grounds. Advantageously a resistor 15 is provided in series with the logic input to the gallium arsenide array 12. This resistor 15 limits the current into the gallium arsenide array 12 in the logic HIGH condition and hence eases the compatibility of voltage levels in the HIGH state.

Figure 2:
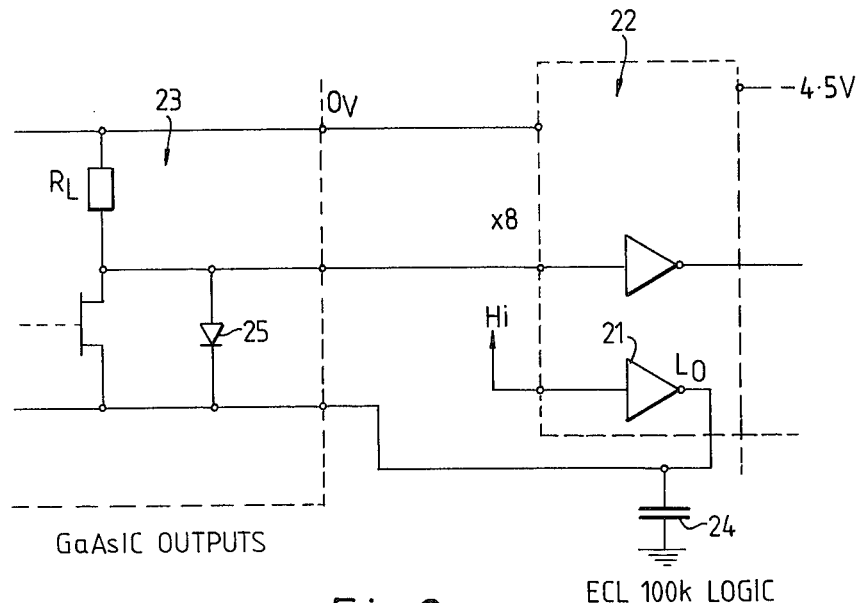
FIG. 2 is a schematic diagram of the output interface of the multiplexer of FIG. 1.

A similar arrangement is employed in the output interface of FIG. 2. In this circuit a gate 21 in the silicon output array 22 is held in its LOW state and provides a defined negative voltage, again typically −1.7 volts, for the gallium arsenide array 23. As before stabilization may be effected with a shunt capacitor 24. Advantageously a shunt diode 25 is provided at the output of the gallium arsenide array 23 to limit the voltage swing of the input to the silicon array 22 so as to maintain maximum speed capability.

Figure 3:
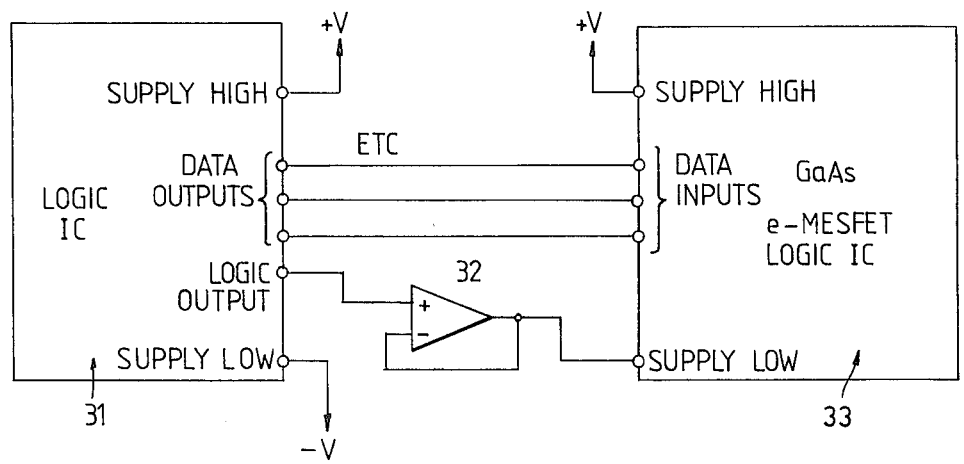
FIG. 3 shows a silicon/gallium arsenide interface incorporating an amplifying power supply stage.

A modified form of power supply is shown in FIG. 3. This arrangement can be used when a gallium arsenide array 33 takes a higher current than can conveniently be provided from a silicon logic gate. In this arrangement a logic gate of a silicon array 31 is held in its LOW state and its output is fed to a current amplifier 32. This provides an enhanced current supply to the gallium arsenide array 33 while maintaining the supply voltage of the latter at a fixed defined level.

What is claimed is:

1. A semi-conductor circuit arrangement powered from an electric power supply which provides a predetermined voltage differential, comprising:
   a first circuit portion powered from the power supply and including a silicon integrated circuit provided with at least one logic gate having a control input and an output;
   a second circuit portion including a gallium arsenide integrated circuit having a reference voltage input connected to the power supply and a power voltage input;
   means for applying such an electric potential to said control input as to maintain said logic gate, in use, in its low state; and
   means for coupling said logic gate output to said power supply voltage input, so that, in use, the power supply voltage for the gallium arsenide integrated circuit is derived from the output voltage of said logic gate in its low state.

2. A circuit arrangement as claimed in claim 1, wherein said coupling means comprises a voltage follower.

3. A circuit arrangement as claimed in either of claims 1 or 2, wherein said logic gate is an emitter coupled logic (ECL) gate.

4. A circuit arrangement as claimed in either of claims 1 or 2, wherein said second circuit portion is a multiplexer.

5. A circuit arrangement as claimed in either of claims 1 or 2, wherein said second circuit portion is a demultiplexer.

* * * * *